United States Patent
Yamashiro et al.

(10) Patent No.: US 10,106,910 B2
(45) Date of Patent: Oct. 23, 2018

(54) METHOD FOR PRODUCING SIC SINGLE CRYSTAL

(71) Applicant: TOYOTA JIDOSHA KABUSHIKI KAISHA, Toyota-shi, Aichi-ken (JP)

(72) Inventors: Kouji Yamashiro, Miyoshi (JP); Nobuhira Abe, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 30 days.

(21) Appl. No.: 15/001,708

(22) Filed: Jan. 20, 2016

(65) Prior Publication Data

US 2016/0215412 A1  Jul. 28, 2016

(30) Foreign Application Priority Data

Jan. 22, 2015 (JP) ................. 2015-010488

(51) Int. Cl.
*C30B 9/06* (2006.01)
*C30B 29/36* (2006.01)

(52) U.S. Cl.
CPC ............ *C30B 9/06* (2013.01); *C30B 29/36* (2013.01)

(58) Field of Classification Search
CPC combination set(s) only.
See application file for complete search history.

(56) References Cited

U.S. PATENT DOCUMENTS

| | | | |
|---|---|---|---|
| 6,117,230 A * | 9/2000 | Ammon | C30B 15/14 117/13 |
| 6,156,119 A | 12/2000 | Hoshi et al. | |
| 6,361,597 B1 * | 3/2002 | Takase | C30B 15/02 117/18 |
| 2013/0284083 A1 * | 10/2013 | Okada | C30B 29/36 117/28 |
| 2014/0299046 A1 | 10/2014 | Domoto et al. | |

FOREIGN PATENT DOCUMENTS

| | | |
|---|---|---|
| CN | 103282559 A | 9/2013 |
| JP | H11-268987 A | 10/1999 |
| JP | 2008-074663 A | 4/2008 |
| JP | 2008-100890 A | 5/2008 |
| WO | 2012-090946 A1 | 7/2012 |
| WO | 2013/062130 A1 | 5/2013 |

* cited by examiner

*Primary Examiner* — Erin F Bergner
(74) *Attorney, Agent, or Firm* — Oliff PLC

(57) ABSTRACT

A method for producing a SiC single crystal, including flowing a high-frequency current at a first frequency to an induction heating coil disposed around a graphite crucible to heat raw material Si to a predetermined temperature, thereby while melting the raw material Si, dissolving out C from said graphite crucible to form a Si—C solution, and after heating to the predetermined temperature, lowering the frequency from the first frequency to a second frequency to warm and hold the Si—C solution.

4 Claims, 4 Drawing Sheets

METHOD FOR PRODUCING SIC SINGLE CRYSTAL

TECHNICAL FIELD

The present invention relates to a method for producing a SiC single crystal by a solution method.

BACKGROUND ART

The solution method is a method where raw material Si is melted in a graphite crucible to form a Si solution, C is dissolved out from the graphite crucible into the Si solution to form a Si—C solution which is then warmed and held, and a seed crystal is put into contact with the Si—C solution, thereby growing a SiC single crystal.

In the solution method, a temperature gradient in which the temperature decreases from the inside toward the solution surface and from the lower part to the upper part is maintained in the Si solution in a graphite crucible during the SiC single crystal growth. C dissolved out in a high-temperature part from the graphite crucible into the Si solution elevates following the convection of the Si—C solution and reaches a low-temperature part in the vicinity of the Si—C solution surface, as a result, C is supersaturated (hereinafter, sometimes referred to as a C-supersaturated part) in the vicinity of the Si—C solution surface.

Patent Document 1 discloses a method of producing a silicon single crystal by the Czochralski method. In the method disclosed in Patent Document 1, in order to make the in-plane distribution of the oxygen concentration in the produced single crystal uniform, in addition to melting raw material silicon by a resistance heating heater and warming/holding the silicon solution, the silicon solution is caused to undergo convection in a crucible by using a magnet.

Patent Document 2 discloses a production method of a SiC single crystal, where a Si—C solution is warmed and held using an induction heating coil. In the method disclosed in Patent Document 2, the temperature of the Si—C solution is controlled by controlling the current value of a high-frequency current flowed to the induction heating coil. Therefore, in the case of the production method disclosed in Patent Document 2, mainly natural convection is generated.

RELATED ART

Patent Document

[Patent Document 1] Japanese Unexamined Patent Publication No. H11-263987
[Patent Document 2] Japanese Unexamined Patent Publication No. 2003-74663

SUMMARY OF THE INVENTION

Problems to be Solved by the Invention

In the method disclosed in Patent Document 1, convection surpassing natural convention can be generated in the Si solution in the crucible. However, a magnet for convection generation needs to be separately disposed, resulting in upsizing of the single crystal production apparatus.

In the method disclosed in Patent Document 2, since mainly natural convection is generated, the convection is not enough to form a C-supersaturated part.

As described above, a production method of a SiC single crystal, in which a Si—C solution in a graphite crucible can undergo sufficient convection without upsizing the single crystal production apparatus, has been sought.

An object of the present invention is to provide a production method of a SiC single crystal, which can solve the above-described problem.

Means to Solve the Problems

The gist of the present invention is as follows.
<1> A method for producing a SiC single crystal by a solution method of bringing a seed crystal into contact with a Si solution of C to grow a SiC single crystal, the production method of a SiC single crystal comprising: flowing a high-frequency current at a first frequency to an induction heating coil disposed around a graphite crucible to heat raw material Si to a predetermined temperature, thereby while melting the raw material Si, dissolving out C from the graphite crucible to form a Si—C solution, and after heating to the predetermined temperature, lowering the frequency from the first frequency to a second frequency to warm and hold the Si—C solution.
<2> The method according to claim 1, wherein the frequency of the high-frequency current is alternately switched between the first frequency and the second frequency a plurality of time during warming and holding of the Si—C solution.
<3> The method according to item <1> or <2>, wherein the first frequency is from 4 to 6 kHz.
<4> The method according to any one of items <1> to <3>, wherein the second frequency is from 0.5 to 2 kHz.

Effects of the Invention

According to the present invention, during warming and holding of a Si—C solution, the frequency of the high-frequency current flowed to an induction heating coil is set lower than that at the time of heating of raw material Si to facilitate generation of convection of the Si—C solution, whereby a production method of a SiC single crystal, in which the apparatus need not be upsized for convection generation, can be provided.

MODE FOR CARRYING OUT THE INVENTION

Figure 1:
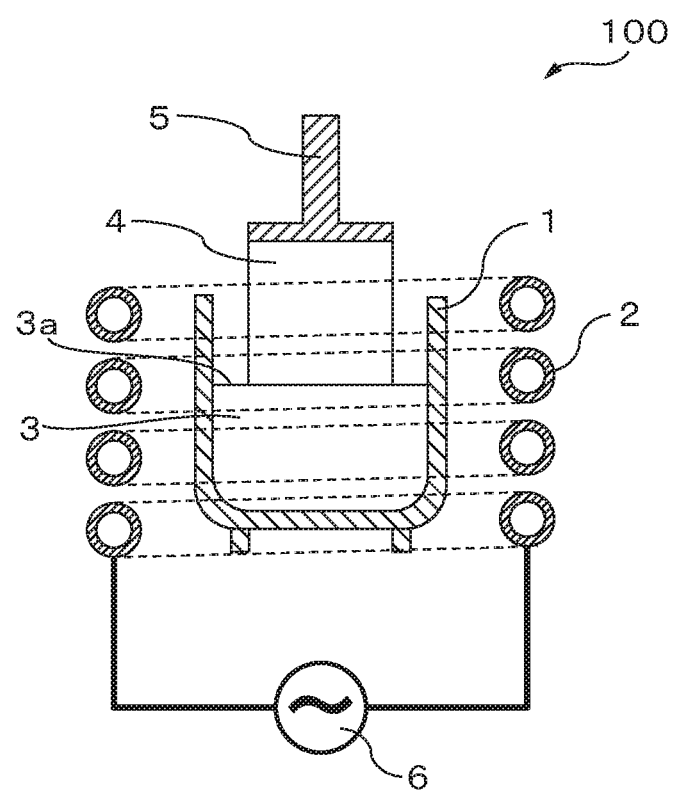
FIG. 1 A view illustrating an example of the outline of the apparatus used for carrying out the present invention.

The embodiments of the production method of a SiC single crystal according to the present invention are described below by referring to the drawings. The present invention is not limited to the following embodiments.

FIG. 1 is a view illustrating an example of the outline of the apparatus used for carrying out the present invention.

The SiC single crystal production apparatus 100 comprises a graphite crucible 1, an induction heating coil 2, and a high-frequency power source 6.

The induction heating coil 2 is disposed around the graphite crucible 1. The induction heating coil 2 and the high-frequency power source 6 are connected, and a high-frequency current is flowed to the induction heating coil 2, whereby raw material Si (not illustrated) is heated to a predetermined temperature. By this heating, while melting the raw material Si, C is dissolved out from the graphite crucible 1 to form a Si—C solution 3. The Si—C solution as used herein means a Si solution of C.

Subsequently, a high-frequency current is flowed to the induction heating coil whereby the Si—C solution 3 is warmed and held at the above-described predetermined temperature. A seed crystal 5 is put into contact with this warmed and held Si—C solution 3 to grow a SiC single crystal 4.

The predetermined temperature is a temperature in the portion where the temperature is highest inside the graphite crucible 1. The predetermined temperature is not particularly limited as long as it is a temperature at which a SiC single crystal can be grown, but the temperature is preferably from 1,900 to 2,200° C. When the predetermined temperature is 1,900° C. or more, not only the raw material Si is melted but also C can be dissolved out raw material Si is melted but also C cars be dissolved out from the graphite crucible 1 to form a Si—C solution 3. On the other hand, when the predetermined temperature is 2,200° C. or less, a temperature gradient from the lower part toward the upper part can be maintained in the vicinity of the Si—C solution surface 3a.

The vicinity of the Si—C solution surface 3a means a depth of up to 3 cm at the deepest from the Si—C solution surface 3a. When a temperature gradient is established to such a depth, a SiC single crystal 4 can be grown starting from the seed crystal 5.

The temperature gradient is preferably from 10 to 20° C./cm. When the temperature gradient is 10° C./cm or more, a SiC single crystal 4 can be grown, and on the other hand, when the temperature gradient is 20° C./cm or less, the convection of the Si—C solution 3 is not inhibited.

A stirring force acts on the solution dissolved by high-frequency heating, and a convection exceeding natural convection is generated in the solution by the stirring force. When a high-frequency current is flowed to the induction heating coil 2, an eddy current is generated in a to-be-heated material. The eddy current is larger closer to the surface of the to-be-heated material and smaller closer to the inside. An indicator indicating the degree thereof is the penetration depth. When the frequency of the high-frequency current is high, the penetration depth is shallow and the heating capability is high, but the stirring force is small. On the other hand, when the frequency of the high-frequency current is low, the penetration depth is deep and the heating capability is low, but the stirring force is large.

In other words, the high-frequency current has high heating capability but low capability of cresting convection in a solution when the frequency is high, and has low healing capability but high capability of creating convection in a solution when the frequency is low.

Therefore, in the present invention, the frequency of the high-frequency current flowed to the induction heating coil 2 is switched between when the raw material Si is heated to a predetermined temperature to form a Si—C solution 3 by dissolving out C from the graphite crucible 1 while melting the raw material Si and when the Si—C solution 3 is warmed and held.

Figure 2:
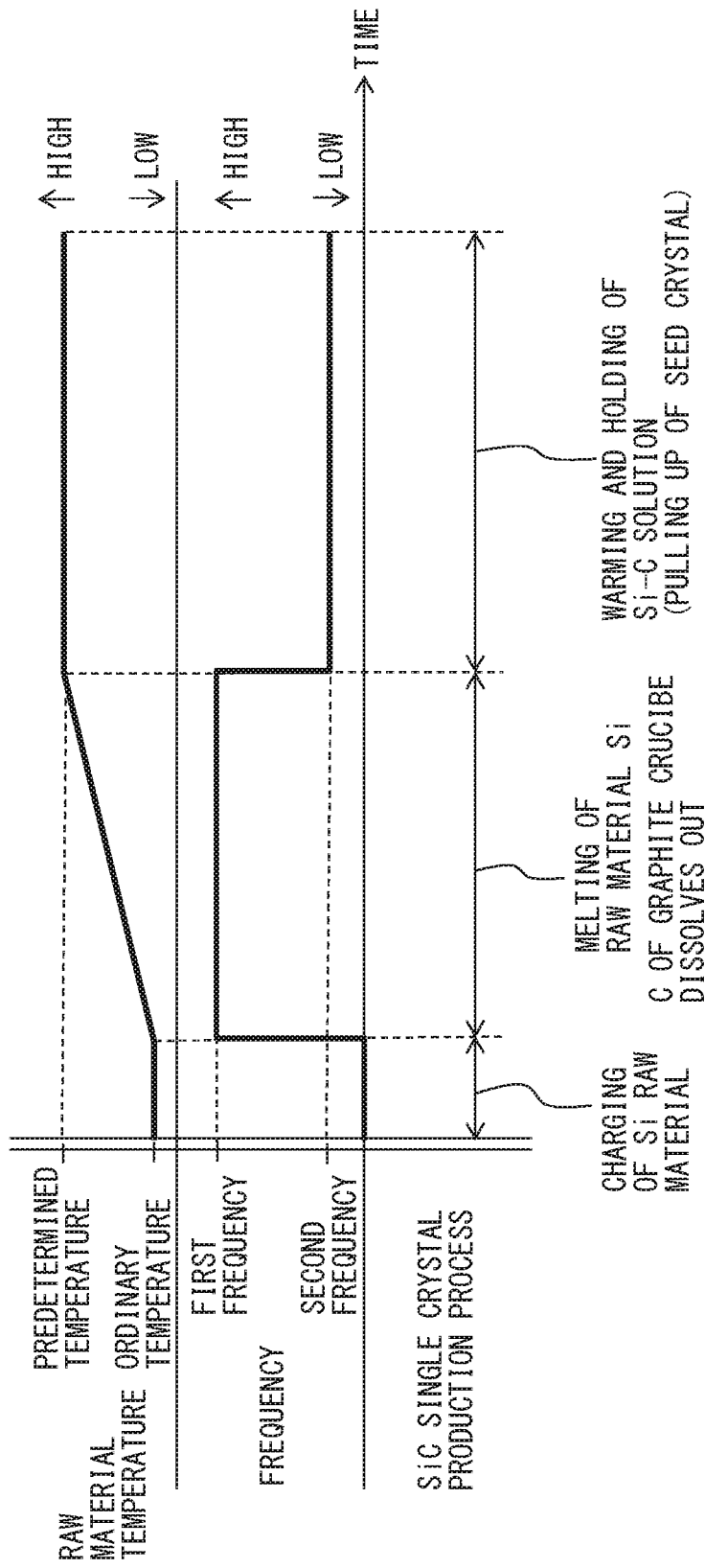
FIG. 2 A view illustrating the frequency switching timing in a first embodiment of the present invention.

FIG. 2 is a view illustrating the frequency switching timing in a first embodiment of the present invention.

After charging raw material Si into the graphite crucible 1, a high-frequency current is caused to start flowing to the induction heating coil 2. The frequency is a first frequency.

The first frequency is not particularly limited as long as it can efficiently heat the raw material Si and is higher than a second frequency. The frequency capable of efficiently heating the raw material Si varies depending on the diameter and depth of the graphite crucible 1, the amount of raw material Si charged, and the spiral pitch of the induction heating coil 2. Accordingly, the first frequency may be appropriately determined by taking into account these factors. The first frequency is preferably from 4 to 6 kHz. When the frequency is 4 kHz or more, the raw material Si can be heated in a short time, and this is efficient. On the other hand, when the frequency is 6 kHz or less, a special high-frequency power source is not needed.

At the point when the Si—C solution 3 reaches a predetermined temperature, the frequency of the high-frequency current is decreased to a second frequency from the first frequency. As described above, the predetermined temperature is the temperature in which a SiC single crystal is growing. When the temperature of the Si—C solution 3 reached the predetermined temperature, the predetermined temperature need not be raised any more and may be sufficient if the solution can be warmed and held.

On the other hand, in order to form a C-supersaturated part on the Si—C solution surface 3a, C dissolved out from the graphite crucible 1 in a high-temperature part at the bottom of the graphite crucible 1 needs to be elevated to the vicinity of the Si—C solution surface 3a by generating convention in the Si—C solution 3.

More specifically, after the Si—C solution 3 reaches the predetermined temperature, the hearing capability is not so required, but the capability of creating convection in the Si—C solution 3 is required.

Therefore, in the present invention, the second frequency is specified to be a frequency lower than the first frequency. The high-frequency current at the second frequency may be sufficient if it has heating capability high enough to warm and hold the Si—C solution 3 and has capability of sufficiently inducing convection of the Si—C solution 3.

The second frequency is not particularly limited as long as it is lower than the first frequency, but the frequency is preferably from 0.3 to 2 kHz. A frequency of 0.5 kHz or more is less likely to lack the warming and holding capability. On the other hand, a frequency of 2 kHz or less is less likely to lack the capability of inducing convection in the Si—C solution 3.

Therefore, by switching the frequency of the high-frequency current, a Si—C solution 3 can be rapidly formed from the raw material Si with a small power source capacity, and the Si—C solution 3 can undergo sufficient convection.

The circuit for switching the frequency of the high-frequency current is not particularly limited as long as switching between desired first frequency and second frequency can be achieved while watching the impedance of a high-frequency current generation source to that of a to-be-heated material.

Figure 3:
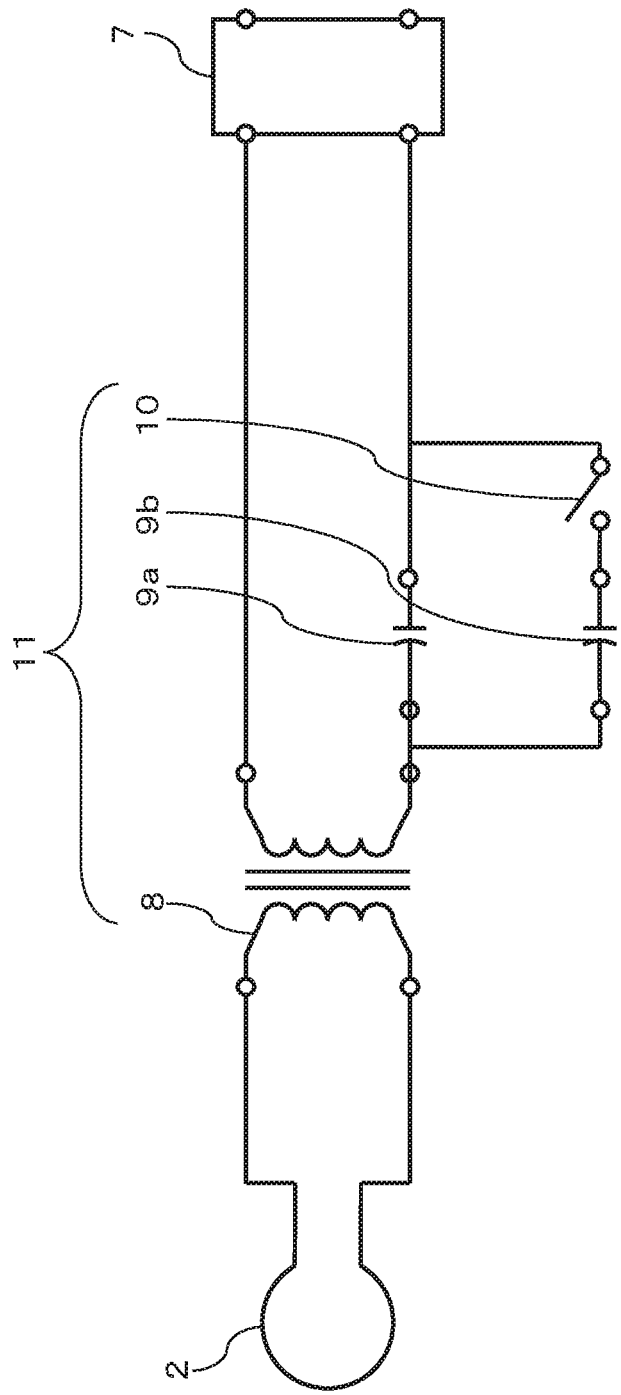
FIG. 3 A view illustrating an example of the frequency switching circuit used for carrying out the present invention.

FIG. 3 is a view illustrating an example or the frequency switching circuit used for carrying out the present invention.

The high-frequency current is generated by an inverter 7. In order to match the impedance of the inverter 7 to that of the raw material Si as a to-be-heated material, a transformer 8 and capacitors 9a and 9b are connected between the induction heating coil 2 and the inverter 7. That is, the transformer 8, the capacitors 9 and 9b, and a selector switch 10 constitute a matching box 11.

In the example illustrated in FIG. 3, capacitors 9a and 9b are connected in parallel. In addition, the selector switch 10 is provided in order to select connecting only the capacitor 9a or connecting both the capacitor 9a and the capacitor 9b.

As for the capacitor, the amount of its capacitance, the quantities of capacitor, and the connection method (in series and/or in parallel) may be appropriately selected according to the selection of the frequency of the first frequency and second frequency, and matching of the impedance of the inverter 7 to that of the raw material Si as a to-be-heated material. The same applies to the selector switch.

At the time of growing a SiC single crystal 4 by warming and holding the Si—C solution 3, depending on the growth conditions, the temperature of the warmed and held Si—C solution 3 may be lowed. In such a case, the second embodiment described below is effective.

Figure 4:
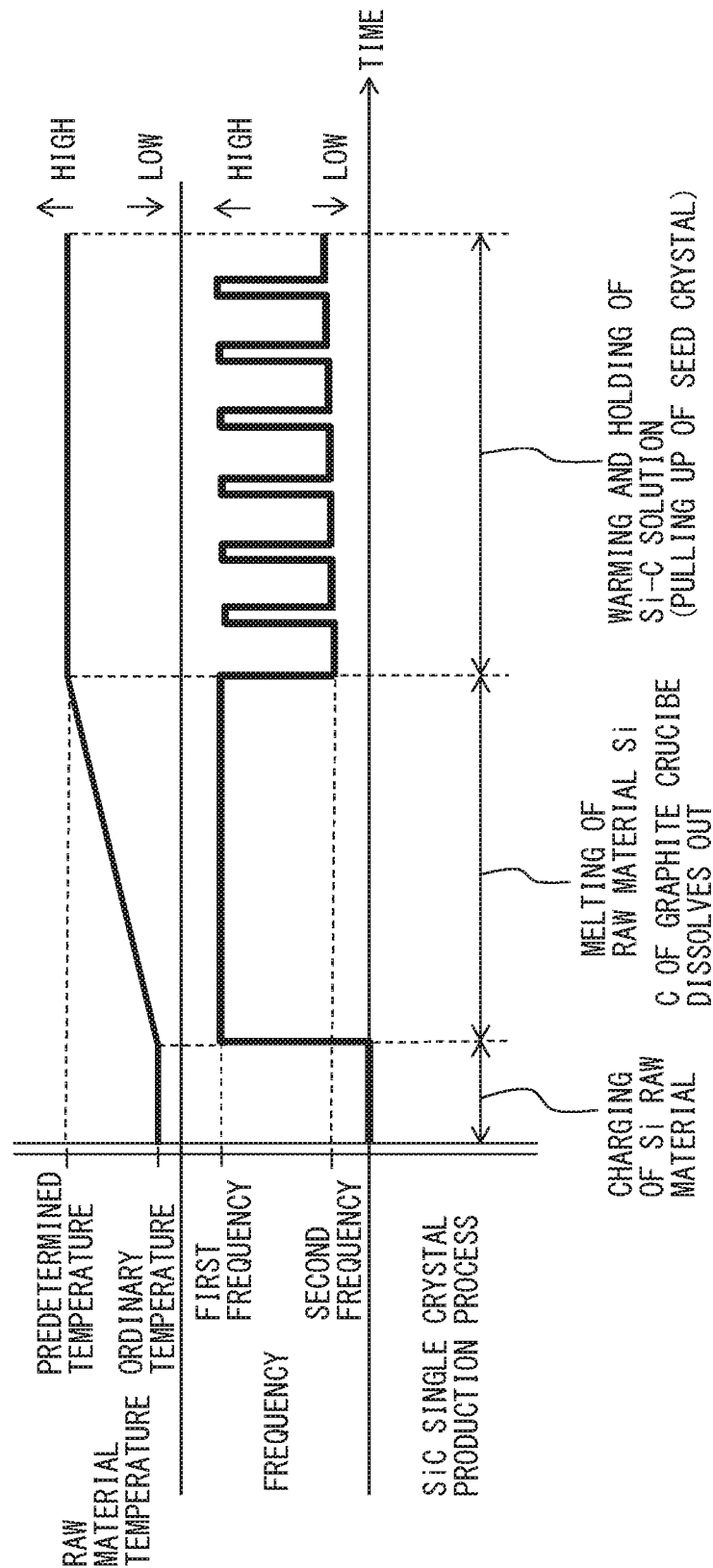
FIG. 4 A view illustrating the frequency switching timing in a second embodiment of the present invention.

FIG. 4 is a view illustrating the frequency switching timing in a second embodiment of the present invention.

Charging raw material Si into a graphite crucible 1 and then flowing a high-frequency current at a first frequency to an induction heating coil 2 until a Si—C solution 3 reaches a predetermined is the same as the first embodiment. In addition, switching the first frequency of the high-frequency current to the second frequency when the Si—C solution 3 reaches a predetermined temperature is the same as the first embodiment.

After switching to the second frequency, when the temperature of the Si—C solution 3 lowers during warming and holding of the Si—C solution 3, the frequency of the high-frequency current is again switched to the first frequency. By this switching, the lowered warming/holding temperature can be recovered to the predetermined temperature by the high-frequency current at the first frequency excellent in the heating capability. However, if the current is continuously kept at the first frequency, the convection of the Si—C solution 3 becomes insufficient to reduce the C concentration in the C-supersaturated part. Therefore, the frequency is again switched to the second frequency.

Therefore, as illustrated in FIG. 4, after the temperature of the Si—C solution 3 reaches a predetermined temperature, the frequency of the high-frequency current is alternately switched between the first frequency and the second frequency a plurality of times. The time for which the first frequency is selected and the time for which the second frequency is selected may be appropriately determined according to the balance between the recovery of the warming and holding temperature and the maintenance of the C-supersaturated part.

EXAMPLES

Production of a SiC single crystal was performed by setting the first frequency to 5 kHz and the second frequency to 1 kHz.

For the switching of the high-frequency current, the circuit illustrated in FIG. 3 was used. The capacitance of the capacitor 9a was 2 µF, the capacitance of the capacitor 9b was 44 µF, and the capacitor 9a and the capacitor 9b were connected in parallel.

At the time of switching of the frequency of the high-frequency current to 5 kHz (first frequency), the selector switch 10 was opened to actuate only the capacitor 9a. At the time of switching of the frequency of the high-frequency current to 1 kHz (second frequency), the selector switch 10 was closed to actuate both the capacitor 9a and the capacitor 9b.

As a result, a high-frequency current of 5 kHz flowed in an amount of 120 A to the induction heating coil 2, and a Si—C solution 3 at 2,000° C. could be obtained. Thereafter, the frequency of the high-frequency current was switched to 1 kHz, and the solution could be warmed and held at the same temperature as above.

INDUSTRIAL APPLICABILITY

According to the present invention, a production method of a SiC single crystal, in which a Si—C solution can undergo sufficient convection without upsizing the production apparatus, can be provided. Hence, there is great industrial applicability in the present invention.

DESCRIPTION OF NUMERICAL REFERENCES

1 Graphite crucible
2 Induction heating coil
3 Si—C Solution
3a Si—C Solution surface
4 SiC Single crystal
5 Seed crystal
6 High-frequency power source
7 Inverter
8 Transformer
9a, 9b Capacitor
10 Selector switch
11 Matching box
100 SiC Single crystal production apparatus

The invention claimed is:

1. A method for producing a SiC single crystal by a solution method of bringing a seed crystal into contact with a Si solution of C to grow a SiC single crystal, the production method of a SiC single crystal comprising:
    flowing a high-frequency current at a first frequency to a spiral induction heating coil disposed around a graphite crucible to heat raw material Si to a predetermined temperature, thereby while melting said raw material Si, dissolving out C from said graphite crucible to form a Si—C solution, and
    after heating to said predetermined temperature, lowering the frequency from the first frequency to a second frequency, thereby while inducing convection of the Si—C solution, warming and holding said Si—C solution at the predetermined temperature from 1900 degrees Celsius to 2200 degrees Celsius and maintaining a temperature gradient at a depth of up to 3 centimeters from the Si—C solution surface from 10 degrees Celsius per centimeter to 20 degrees Celsius per centimeter, wherein
    the frequency of the high-frequency current is alternately switched between the first frequency and the second frequency a plurality of times during warming and holding of said Si—C solution to obtain a balance between recovery of warming and holding temperature of the Si—C solution and maintenance of a C-supersaturated part.

2. The method according to claim 1, wherein said first frequency is from 4 to 6 kHz.

3. The method according to claim 1, wherein said second frequency is from 0.5 to 2 kHz.

4. The method according to claim 2, wherein said second frequency is from 0.5 to 2 kHz.

* * * * *